United States Patent
Cho et al.

(10) Patent No.: US 9,328,848 B2
(45) Date of Patent: May 3, 2016

(54) VACUUM ISOLATION VALVE

(71) Applicant: MST Engineering co., ltd., Cheonan-si, Chungcheongnam-do (KR)

(72) Inventors: Hanjung Cho, Cheonan-si (KR); Sangho Kim, Asan-si (KR)

(73) Assignee: MST ENGINEERING CO., LTD., Chungcheongnam-Do (KR)

(*) Notice: Subject to any disclaimer, the term of this patent is extended or adjusted under 35 U.S.C. 154(b) by 210 days.

(21) Appl. No.: 14/140,655

(22) Filed: Dec. 26, 2013

(65) Prior Publication Data

US 2014/0261756 A1 Sep. 18, 2014

(30) Foreign Application Priority Data

Mar. 13, 2013 (KR) .................... 10-2013-0026770

(51) Int. Cl.
*B08B 5/00* (2006.01)
*F16K 51/02* (2006.01)
*F16K 3/18* (2006.01)
*H01J 37/18* (2006.01)
*H01J 37/32* (2006.01)
*H01L 21/67* (2006.01)

(52) U.S. Cl.
CPC . *F16K 51/02* (2013.01); *F16K 3/18* (2013.01); *H01J 37/18* (2013.01); *H01J 37/32862* (2013.01); *H01J 2237/006* (2013.01); *H01J 2237/022* (2013.01); *H01L 21/67017* (2013.01); *Y10T 137/4245* (2015.04)

(58) Field of Classification Search
CPC ............... H01J 37/18; H01J 2237/006; H01J 37/32862; H01J 2237/022; F16K 51/02; F16K 3/18; H01L 21/67017
See application file for complete search history.

(56) References Cited

U.S. PATENT DOCUMENTS

| 6,561,484 | B2* | 5/2003 | Nakagawa | F16K 51/02 251/175 |
|---|---|---|---|---|
| 2004/0007682 | A1* | 1/2004 | Kajitani | F16K 31/1221 251/63.6 |
| 2006/0266962 | A1* | 11/2006 | Kanzaka | F16K 51/02 251/63.6 |
| 2007/0257220 | A1* | 11/2007 | Litscher | F16K 3/0254 251/62 |
| 2009/0114296 | A1* | 5/2009 | Tsuda | F16K 11/044 137/613 |
| 2010/0117018 | A1* | 5/2010 | Gantner | F16K 51/02 251/318 |

FOREIGN PATENT DOCUMENTS

| JP | 11-125346 | 5/1999 | | |
|---|---|---|---|---|
| KR | 10-0740036 | 7/2007 | | |
| KR | WO2007142395 A1 * | 12/2007 | ................ | F16K 3/18 |

* cited by examiner

*Primary Examiner* — Craig Schneider
*Assistant Examiner* — Kevin Barss
(74) *Attorney, Agent, or Firm* — Young & Thompson

(57) ABSTRACT

The vacuum isolation valve includes a housing installed between a chamber and a chamber cleaning gas supply and including a tube connecting the chamber to the chamber cleaning gas supply, a tube isolator formed at a predetermined position of the tube, a first blocking unit installed to the housing, and a second blocking unit installed to the housing, for, when the first blocking unit moves in the first direction, maintaining communication between the chamber and the chamber cleaning gas supply by moving in a second direction and pressing the first blocking unit and for, when the first blocking unit moves in an opposite direction to the first direction, blocking communication between the chamber and the chamber cleaning gas supply.

17 Claims, 9 Drawing Sheets

VACUUM ISOLATION VALVE

This application claims the benefit of Korean Patent Application No. 10-2013-0026770, filed on Mar. 13, 2013, which is hereby incorporated by reference as if fully set forth herein.

BACKGROUND OF THE INVENTION

1. Field of the Invention

The present invention relates to a vacuum isolation valve, and more particularly, to a vacuum isolation valve for effectively maintaining the inside of a chamber in a vacuum state by selectively isolating a tube that transfers a chamber cleaning gas and minimizing abrasion of a sealing member installed at a blocking part that blocks the tube.

2. Discussion of the Related Art

In general, a process requiring high precision such as a semiconductor or Liquid Crystal Display (LCD) fabrication process takes place in a space isolated from the outside and maintained at a constant temperature, such as a chamber. When the process is completed inside the chamber, foreign materials remain due to a processing gas in the chamber. Thus a chamber cleaning gas is injected into the chamber and the remaining foreign materials are removed by the chamber cleaning gas. The chamber is connected through a connection means such as a cleaning gas ionization module and a tube and receives an ionized chamber cleaning gas from the cleaning gas ionization module.

Nitrogen trifluoride (NF3) is used as a chamber cleaning gas ionized in the cleaning gas ionization module in order to increase process throughput and a cleaning rate. However, the cleaning gas ionization module is vulnerable to abrasion and breakdown by nitrogen (N) and fluoride (F) ions of the nitrogen trifluoride in the course of ionization of the nitrogen trifluoride. As a consequence, the cleaning gas ionization module should be replaced with a new one periodically or aperiodically.

For efficient processing, the chamber should be kept suitable for ongoing processing and thus isolated from an ambient environment even during replacement of the cleaning gas ionization module. That is, the inside of the chamber should be kept vacuum and discharge of air and heat from the chamber should be prevented. If the air and heat are discharged from the inside of the chamber during replacement of the cleaning gas ionization module, the vacuum state and temperature are changed inside the chamber, thereby changing an ongoing process state in the chamber. Then the inner temperature of the chamber should be re-raised to a level suitable for cleaning, re-vacuuming, and processing. The resulting process delay significantly reduces an overall process throughput.

However, no equipment is conventionally installed at a tube that connects the chamber and the cleaning gas ionization module, which keeps the chamber isolated from the outside through selective isolation of the tube. Therefore, when the cleaning gas ionization module is replaced, the chamber may not be isolated from an ambient environment.

SUMMARY OF THE INVENTION

Accordingly, the present invention is directed to a vacuum isolation valve that substantially obviates one or more problems due to limitations and disadvantages of the related art.

An object of the present invention is to provide a vacuum isolation valve for facilitating isolation of a chamber from an ambient environment by selectively blocking a tube that connects the chamber to a chamber cleaning gas supply.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a vacuum isolation valve includes a housing installed between a chamber and a chamber cleaning gas supply and including a tube connecting the chamber to the chamber cleaning gas supply, for enabling communication between the chamber and the chamber cleaning gas supply, a tube isolator formed at a predetermined position of the tube, for selectively isolating the tube, a first blocking unit installed to the housing, for maintaining communication between the chamber and the chamber cleaning gas supply by moving in a first direction and selectively blocking an opened first surface of the tube isolator, and a second blocking unit installed to the housing, for, when the first blocking unit moves in the first direction, maintaining communication between the chamber and the chamber cleaning gas supply by moving in a second direction and pressing the first blocking unit and for, when the first blocking unit moves in an opposite direction to the first direction, blocking communication between the chamber and the chamber cleaning gas supply by moving further in the second direction and passing through the first surface of the tube isolator, being inserted into the tube isolator, and blocking the tube, in close contact with a surface facing the first surface.

The first direction may be perpendicular to the second direction.

A first opening may be formed on a second surface of the tube isolator facing the first surface of the tube isolator, for passing a chamber cleaning gas supplied from the chamber cleaning gas supply, and a second opening may be formed on a third surface of the tube isolator near to the second surface of the tube isolator, for passing the chamber cleaning gas.

When the first blocking unit moves in the opposite direction to the first direction, the second blocking unit may close the first opening by moving in the second direction, being inserted into the tube isolator through the first surface, and closely contacting the second surface.

The housing may include a first installation hole extended from the first surface, and a second installation hole branched from the first installation hole. The first installation hole may be perpendicular to the second installation hole.

The first blocking unit may include a body fixed to the housing, extended from an end portion of the second installation hole, a first mover installed in the body, movably in the first direction, a joint member engaged with a portion of the first mover, movably in the first direction, and a first blocker engaged with a portion of the joint member, for selectively blocking the first surface of the tube isolator by moving in the first direction.

The body may be hollow to communicate with the second installation hole.

The first mover may include a handle installed rotatably at a portion of the body, a rotating shaft fixed to a center of the handle, inside the body, and a vertical movement member accommodated in the body, which is engaged with the joint member at a first end of the vertical movement member, and screw-engaged with the rotating shaft at a second end of the vertical movement member to be movable in the first direction.

The first blocking unit may further include a first bellows connecting an inner surface of the body to one surface of the first blocker, for accommodating the vertical movement member and the joint member.

The first blocker may have a 'T'-shaped section.

A first sealing member may be installed on a surface of the first blocker facing the first surface.

The first sealing member may be an O-ring.

The second blocking unit may include a cover fixed in the first installation hole and having an engagement hole formed at a center of the cover, a second mover screw-engaged with the engagement hole to be movable in the second direction, and a second blocker engaged with a portion of the second mover, for pressing the first blocking unit or selectively blocking the tube isolator by moving in the second direction.

An engagement member may be formed at a portion of the second mover, a container may be formed on a surface of the second blocker, for accommodating the engagement member, and the engagement member may be rotatable in the container.

The second blocking unit may further include a second bellows connecting one surface of the cover to one surface of the second blocker, for accommodating the second mover.

A second sealing member may be installed on a surface of the second blocker closely contacting the second surface.

The second sealing member may be an O-ring.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

The objectives and effects of the present invention and the technical configurations of the present invention to achieve them will be apparent with reference to embodiments of the present invention described in detail with the attached drawings. A detailed description of a generally known function and structure of the present invention will be avoided lest it should obscure the subject matter of the present invention. Although the terms used in the present invention are selected from generally known and used terms, taking into account the structures, roles, and functions of the present invention, they are subject to change depending on the intention of a user or an operator or practices.

It is to be clearly understood that the present invention may be implemented in various manners, not limited to embodiments as set forth herein. The embodiments of the present invention are provided only to render the disclosure of the present invention comprehensive and indicate the scope of the present invention to those skilled in the art. The present invention is defined only by the appended claims. Accordingly, the scope of the invention should be determined by the overall description of the specification.

Through the specification, when it is said that some part "includes" a specific element, this means that the part may further include other elements, not excluding them, unless otherwise mentioned.

With reference to the attached drawings, a vacuum isolation valve according to an embodiment of the present invention will be described below in detail.

Figure 1:
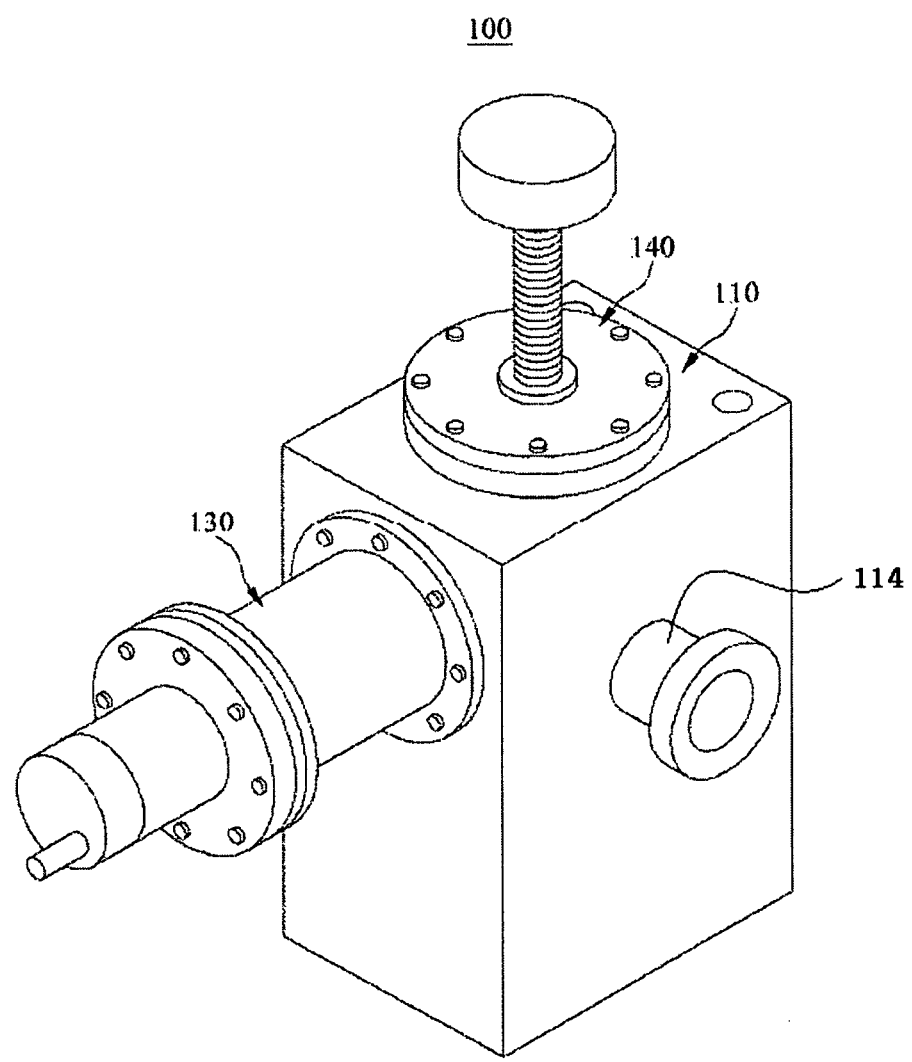
FIG. 1 is a perspective view of a vacuum isolation valve according to an embodiment of the present invention.
Figure 2:
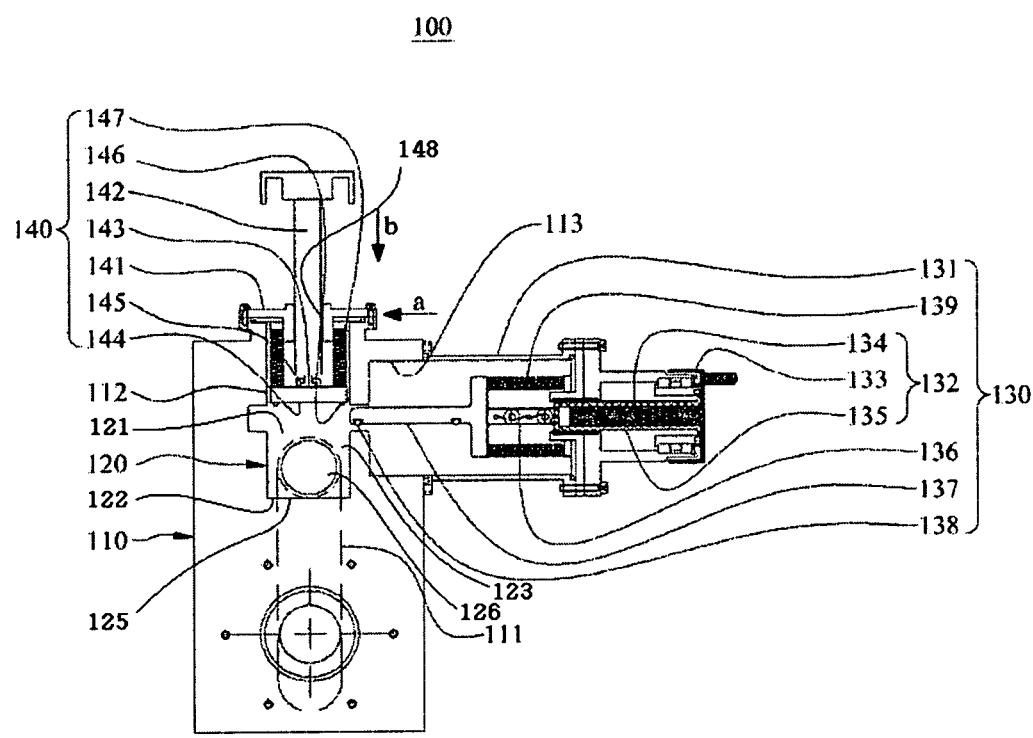
FIG. 2 is a sectional view illustrating the interior of the vacuum isolation valve according to the embodiment of the present invention.

FIG. 1 is a perspective view of a vacuum isolation valve 100 according to an embodiment of the present invention and FIG. 2 is a sectional view illustrating the interior of the vacuum isolation valve 100 according to the embodiment of the present invention.

Referring to FIGS. 1 and 2, the vacuum isolation valve 100 includes a housing 110 that is installed between a chamber (not shown) and a chamber cleaning gas supply (not shown) and has a tube 111 connecting the chamber to the chamber cleaning gas supply so that the chamber may communicate with the chamber cleaning gas supply, a tube isolator 120 formed at a specific position of the tube 111, to selectively isolate the tube 111, a first blocking unit 130 that is installed to the housing 110 and configured to move in a first direction a and thus selectively block an opened first surface 121 of the tube isolator 120 so that the chamber and the chamber cleaning gas supply may be kept communicating with each other and a second blocking unit 140 that is installed to the housing 110 and that is configured, when the first blocking unit 130 moves in the first direction a, to move in a second direction b and press the first blocking unit 130 so that the chamber and the chamber cleaning gas supply may be kept communicating with each other, and when the first blocking unit 130 moves in the opposite direction to the first direction a, to move further in the second direction b, pass through the first surface 121 of the tube isolator 120, and thus be inserted into the tube isolator 120, thereby blocking the tube 111, in close contact with a surface facing the first surface 121 and then blocking communication between the chamber and the chamber cleaning gas supply.

The housing 110 may be engaged with the chamber on one surface of the housing 110 and with the chamber cleaning gas supply on the other surface of the housing 110. The chamber cleaning gas supply may supply a chamber cleaning gas to the chamber through the tube 111 mounted inside the housing 110.

A first installation hole 112 may be formed extended from the opened first surface 121 of the tube isolator 120 in the housing 110. Further, a second installation hole 113 may be branched from the first installation hole 112 in the housing 110. Herein, the first installation hole 112 and the second installation hole 113 may be perpendicular to each other in the housing 110.

The tube isolator 120 may be formed at a predetermined position of the tube 111. The tube isolator 120 may be formed into a predetermined shape at the predetermined position of the tube 111. For example, the tube isolator 120 may be shaped into a hexahedron at the predetermined position of the tube 111, which should not be construed as limiting the present invention.

For the convenience of description, a surface of the tube isolator 120 formed into a hexahedron, which is opened to communicate with the first installation hole 112 of the housing 110 is defined as the first surface 121, a surface facing the first surface 121 is defined as a second surface 122, and a surface connecting the first surface 121 to the second surface 122 is defined as a third surface 123.

The tube isolator 120 may be formed into a hexahedron at the predetermined position of the tube 111. The tube isolator 120 may be hollow inside. The first surface 121 of the tube isolator 120 may be opened so that a second blocker 144 of the later-described second blocking unit 140 may be inserted through the first surface 121. In addition, a first opening 125 may be formed into the second surface 122 facing the first surface 121 of the tube isolator 120, in such a manner that the first opening 125 may communicate with the tube 111 of the housing 110. A second opening 126 may be formed into the third surface 123 near to the second surface 122 in the tube isolator 120 in such a manner that the second opening 126 may communicate with the tube 114 of the housing 110. The tube isolator 120 may pass the chamber cleaning gas received from the chamber cleaning gas supply through the first and second openings.

For example, when the chamber cleaning gas supply supplies the chamber cleaning gas through the tube 111 of the housing 110, the chamber cleaning gas may be introduced into the tube isolator 120 through the first opening 125 and then discharged into the tube 114 communicating with the second opening 126, thus being supplied to the chamber.

The first blocking unit 130, which is installed in the second installation hole 113 of the housing 110, may move in the first direction a, thus selectively blocking the first surface 121 of the tube isolator 120.

The first blocking unit 130 includes a body 131. The body 131 may be fixed to the housing 110, extended from one end portion of the second installation hole 113. The body 131 may be fixedly engaged with the housing 110 by a separate engagement means. The engagement means may be, for example, a screw or the like, to which the present invention is not limited.

The body 131 may be hollow to communicate with the second installation hole 113. The body 131 may have a leakage-proof member formed on a surface contacting the housing 110 to thereby prevent leakage of the chamber cleaning gas to the outside of the housing 110.

The first blocking unit 130 includes a first mover 132. The first mover 132 may be installed inside the body 131, movably in the first direction a.

The first mover 132 may include a handle 133 installed rotatably at an end of the body 131, a rotating shaft 134 that is mounted in the body 131, fixed to the center of the handle 133, and a vertical movement member 135 that is mounted in the body 131, engaged with a later-described joint member 136 of the first blocking unit 130 at one end of the vertical movement member 135 and screw-engaged with the rotating shaft 134 at the other end of the vertical movement member 135 so as to move in the first direction a. When the handle 133 rotates in a direction, the first mover 132 may move the vertical movement member 135 screw-engaged with the rotating shaft 134 in the first direction a.

The first blocking unit 130 includes the joint member 136. One end of the joint member 136 may be engaged with the first mover 132. The end of the joint member 136 may be engaged with the vertical movement member 135 of the first mover 132. Therefore, the joint member 136 may move in the first direction a by means of the vertical movement member 135.

Since the joint member 136 has a plurality of joints, the joint member 136 may be bent in a direction and a specific part of the joint member 136 may rotate. As the joint member 136 is bent in the direction, the first blocker 137 of the first blocking unit 130 may be brought into close contact with the first surface 121 of the tube isolator 120. As the specific part of the joint member 136 rotates, the first blocker 137 may not rotate even though the vertical movement member 135 moves in the first direction a or in the opposite direction to the first direction a.

The first blocking unit 130 includes the first blocker 137. The first blocker 137 may be engaged with one end of the joint member 136. As the first blocker 137 is engaged with the joint member 136, the first blocker 137 may move in the first direction a. The first blocker 137 may move in the first direction a and thus may be placed over the first surface 121 of the tube isolator 120. As the second blocker 144 of the second blocking unit 140 presses one surface of the first blocker 137, the first blocker 137 may selectively block the first surface 121 of the tube isolator 120 by covering the first surface 121.

The first blocker 137 may have a 'T'-shaped section. A protrusion formed at a portion of the first blocker 137 may be caught over one surface of the housing 110. Therefore, when the first blocker 137 is inserted into the housing 110, the protrusion of the first blocker 137 prevents an end of the first blocker 137 from bumping against an inner wall of the housing 110 and thus being damaged.

A first sealing member 138 may be mounted on a surface of the first blocker 137 facing the first surface 121 of the tube isolator 120. The first sealing member 138 may be an O-ring installed on one surface of the first blocker 137. The diameter of the first sealing member 138 may be larger than the diagonal length of the first surface 121 of the tube isolator 120. Thus, the first blocker 137 may effectively prevent leakage of the chamber cleaning gas through the first surface 121 of the tube isolator 120.

A sealing groove (not shown) may be recessed to a predetermined depth in the first blocker 137, to accommodate the first sealing member 138. The first sealing member 138 may be partially inserted into the sealing groove in the first blocker 137. Therefore, while the first blocker 137 is blocking the first surface 121 of the tube isolator 120, the first sealing member 138 is exposed to the chamber cleaning gas over a reduced area, resulting in reduction of damage that the chamber cleaning gas does to the sealing member 138.

The first blocking unit 130 may further include a first bellows 139 extendable along a length direction. The first bellows 139 may connect an inner surface of the body 131 to one surface of the first blocker 137. The first bellows 139 accommodates the vertical movement member 135 and the joint member 136, thereby preventing outward exposure of the vertical movement member 135 and the joint member 136. Accordingly, even if the first blocker 137 does not perfectly block the first surface 121 of the tube isolator 120 and thus the chamber cleaning gas leaks, the vertical movement member 135 and the joint member 136 may be protected against exposure to the chamber cleaning gas.

An additional leakage-proof member may be installed at a portion of the first bellows 139 installed to the body 131 to thereby prevent leakage of the chamber cleaning gas outside the body 131.

The second blocking unit 140 is installed in the first installation hole 112 of the housing 110. The second blocking unit 140 may move in the second direction b and thus press the first blocker 137 of the first blocking unit 130. Or the second blocking unit 140 may pass through the first surface 121 of the tube isolator 120, be inserted into the tube isolator 120, and closely contact the second surface 122 of the tube isolator, thereby closing the first opening 125 formed on the second surface 122 of the tube isolator 120. That is, the vacuum isolation valve 100 of the present invention may keep the inside of the chamber airtight by closing the first opening 125 using the second blocking unit 140 and thus isolating the chamber or the tube 111 connected to the chamber cleaning gas supply. The second blocking unit 140 includes a cover 141. The cover 141 is fixed in the first installation hole 112 and may have an engagement hole 148 at the center of the cover 141. The cover 141 may be fixedly engaged with the housing 110 by an additional engagement means. The additional engagement means may be a screw or the like, to which the present invention is not limited. The cover 141 may have a leakage-proof member at a surface of the cover 141 contacting the housing 110. Therefore, the second blocking unit 140 may prevent leakage of the chamber cleaning gas outside the housing 110.

The second blocking unit 140 includes a second mover 142. The second mover 142 may be screw-engaged with the engagement hole 148 of the cover 141 so as to move in the second direction b. The second direction b may be perpendicular to the first direction a.

The second blocking unit 140 includes the second blocker 144. The second blocker 144 may be engaged with an end of the second mover 142. Since the second blocker 144 is engaged with the second mover 142, the second blocker 144 may move in the second direction b. A container 142 may be formed in the second blocker 144 to accommodate an engagement member 143 formed at a portion of the second mover 142. The engagement member 143 may rotate in the container 145. That is, even though the second mover 142 rotates, the second blocker 144 may not rotate.

A second sealing member 146 may be installed at a surface of the second blocker 144 closely contacting the second surface 122 of the tube isolator 120. The second sealing member 146 may be an O-ring installed in the second blocker 144. The diameter of the second sealing member 146 may be larger than the diameter of the first opening 125 formed on the second surface 122 of the tube isolator 120. As a consequence, the second sealing member 146 may isolate the chamber from the outside air-tightly through the first opening 125.

The second blocking unit 140 may further include a second bellows 147 extendable along a length direction. The second bellows 147 may connect one surface of the cover 141 to one surface of the second blocker 144. The second bellows 147 may accommodate the second mover 142, thereby preventing outward exposure of the second mover 142. Therefore, the second bellows 142 may protect the second mover 142 against an external impact. In addition, even though the first blocker 137 does not perfectly block the first surface 121 of the tube isolator 120 and thus the chamber cleaning gas leaks, the second bellows 142 may prevent exposure of the second mover 142 to the chamber cleaning gas.

A leakage-proof member may be installed at a portion of the cover 141 to which the second bellows 147 is installed. Accordingly, the leakage-proof member may prevent leakage of the chamber cleaning gas outside the cover 141 or discharge of the internal air of the chamber outside the cover 141.

Now a description will be given of a method for controlling the tube 111 using the vacuum isolation valve 100 according to an embodiment of the present invention.

For the convenience of description, it is assumed that the handle 133 and the second mover 142 rotate in a clockwise direction to move the first blocker 137 in the first direction a and the second blocker 144 in the second direction b, and the handle 133 and the second mover 142 rotate in a counter-clockwise direction to move the first blocker 137 in the opposite direction to the first direction a and the second blocker 144 in the opposite direction to the second direction b.

Figure 3:
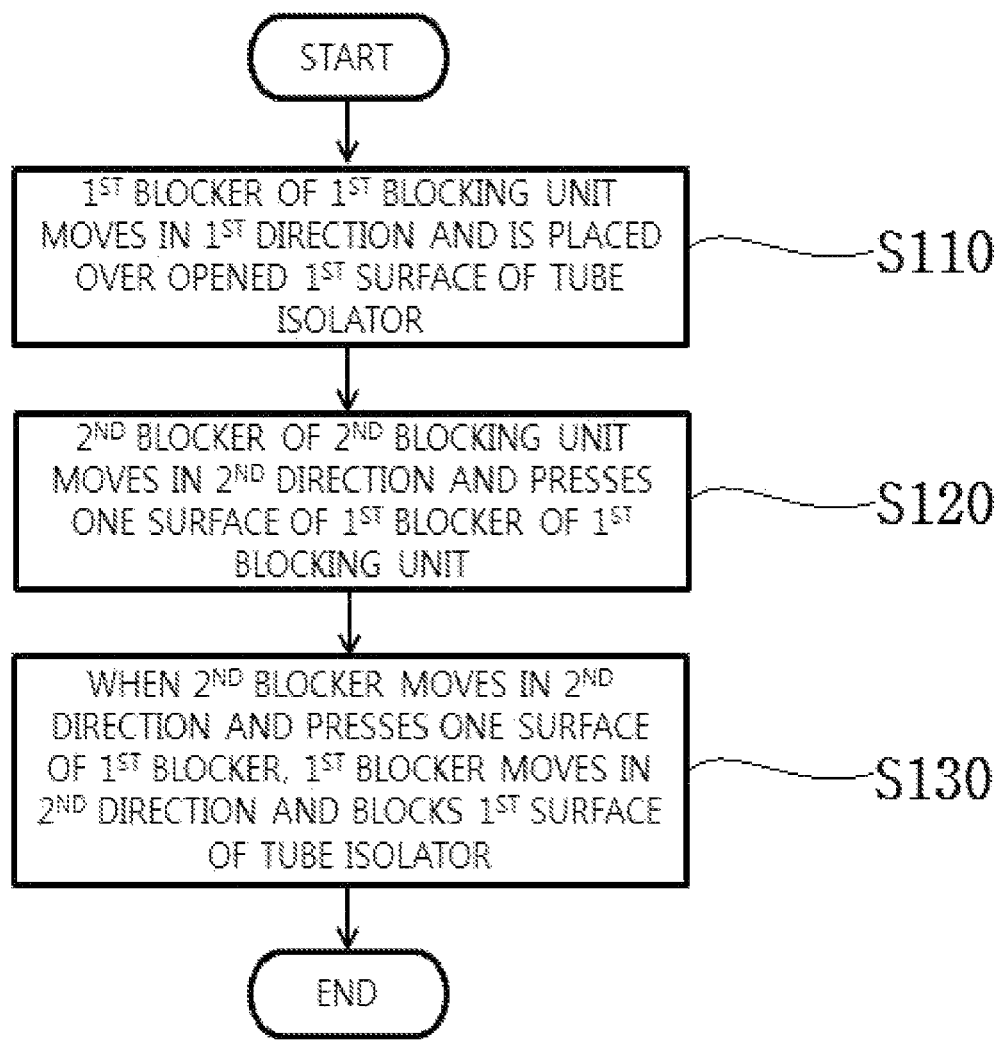
FIG. 3 is a flowchart illustrating an operation for blocking a first surface of a tube isolator by a first blocking unit according to an embodiment of the present invention.
Figure 4:
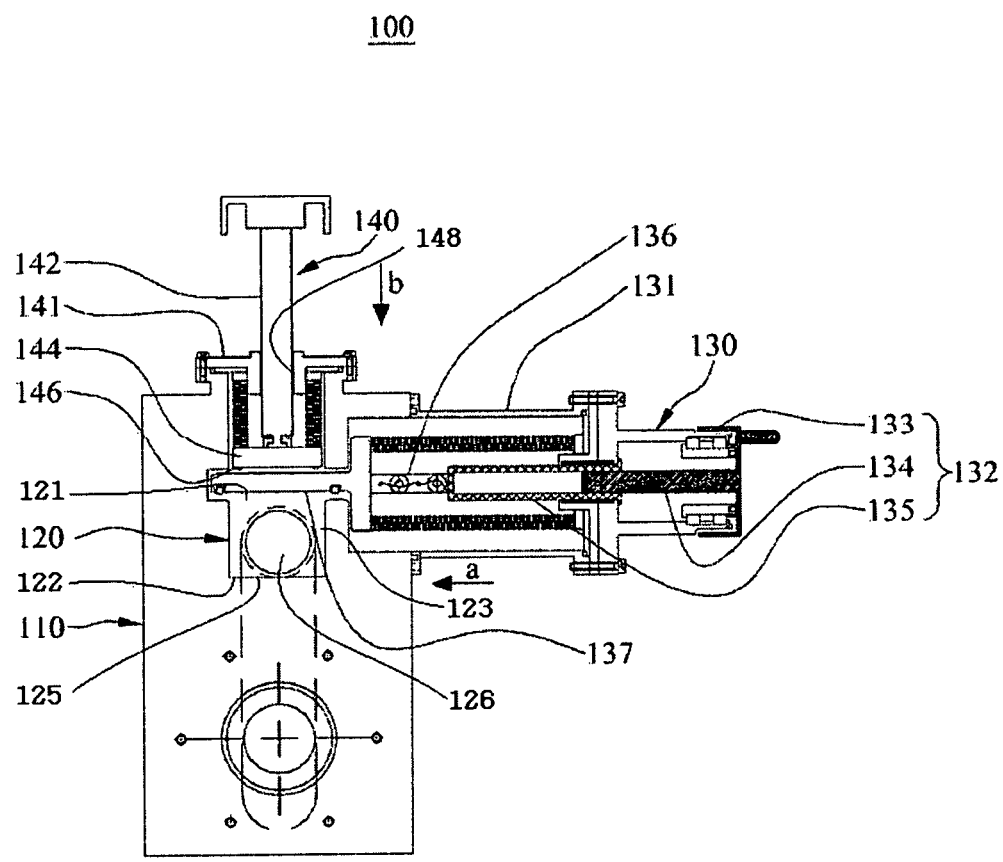
FIG. 4 is a view illustrating a first operation state of the vacuum isolation valve according to an embodiment of the present invention.
Figure 5:
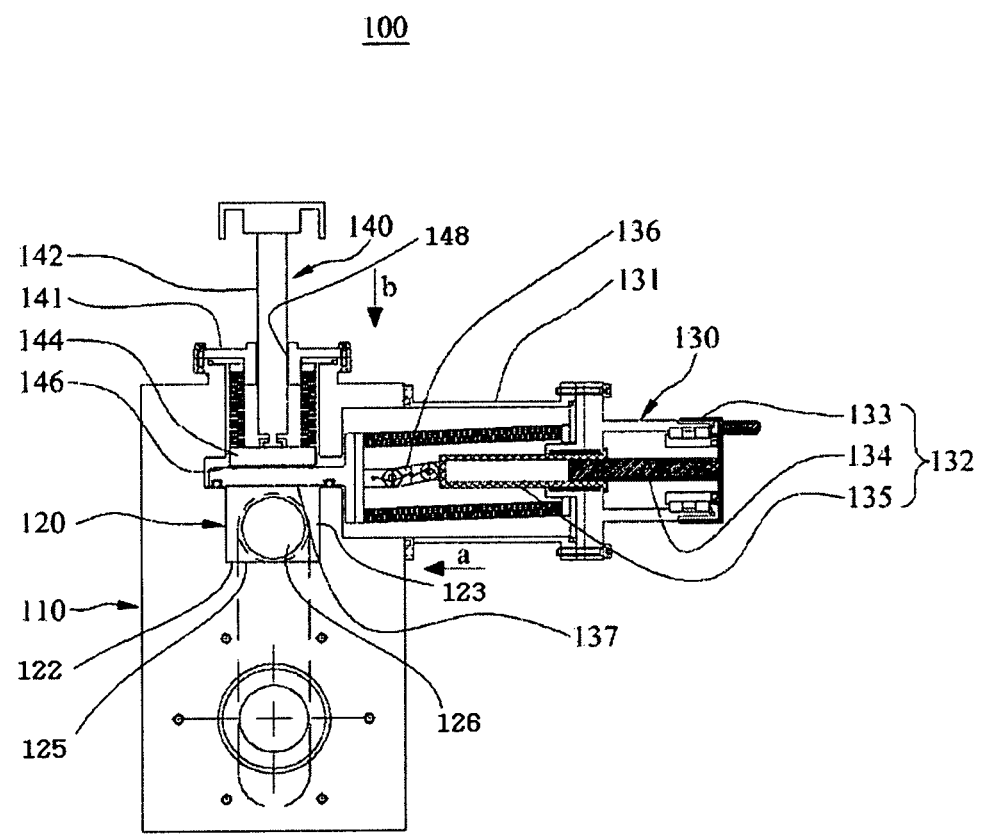
FIG. 5 is a view illustrating a second operation state of the vacuum isolation valve according to an embodiment of the present invention.

FIG. 3 is a flowchart illustrating an operation for blocking the first surface 121 of the tube isolator 120 by means of the first blocking unit 130, FIG. 4 is a view illustrating a first operation state of the vacuum isolation valve 100 according to an embodiment of the present invention, and FIG. 5 a view illustrating a second operation state of the vacuum isolation valve 100 according to an embodiment of the present invention.

Referring to FIGS. 3, 4, and 5, the first blocker 137 of the first blocking unit 130 moves in the first direction a and is placed over the first surface 121 of the tube isolator 120 in operation 5110 (refer to FIG. 4). The first blocker 137 may be moved in the first direction a by means of the first mover 132. For example, when the handle 133 of the first mover 132 rotates clockwise, the rotating shaft 134 fixed at the center of the handle 133 may also rotate clockwise. The handle 133 may be rotated by an operator or automatically in engagement with an additional rotation member, which should not be construed as limiting the present invention. The present invention may include any configuration and structure that rotates the handle 133 manually or automatically. Since the handle 133 rotates at a fixed position of the body 131, the vertical movement member 135 screw-engaged with the rotating shaft 134 may move in the first direction a along the screw thread of the rotating shaft 134. When the vertical movement member 135 moves in the first direction a, the joint member 136 engaged with the vertical movement member 135 and the first blocker 137 engaged with the joint member 136 may move in the first direction a. Eventually, the first blocker 137 may be placed over the first surface 121 of the tube isolator 120.

The second blocker 144 of the second blocking unit 140 moves in the second direction b and thus presses one surface of the first blocker 137 of the first blocking unit 130 in operation 5120 (refer to FIG. 5). Herein, the second blocker 144 may be moved in the second direction b by means of the second mover 142. For example, the second mover 142 may rotate clockwise in screw-engagement with the cover 141. The second mover 142 may be rotated by an operator or automatically in engagement with an additional rotation member, which should not be construed as limiting the present invention. The present invention may include any configuration and structure that rotates the second mover 142 manually or automatically. Since the cover 141 is at a fixed position in the housing 110 during the rotation of the second mover 142, the second mover 142 screw-engaged with the cover 141 may move in the second direction b. When the second mover 142 moves in the second direction b, the second blocker 144 engaged with the second mover 142 may also move in the second direction b. Eventually, the second blocker 144 may press the one surface of the first blocker 137.

When the second blocker 144 moves in the second direction b and presses the surface of the first blocker 137, the first blocker 137 moves in the second direction b and blocks the first surface 121 of the tube isolator 120 in operation S130 (refer to FIG. 5). Because the joint member 136 bendable in one direction is engaged with a portion of the first blocker 137, the first blocker 137 may move in the second direction b, horizontally leveled from over the first surface 121 and then cover the first surface 121. When the first blocker 137 covers the first surface 121, the first opening 125 formed on the second surface 122 of the tube isolator 120 and the second opening 126 formed on the third surface 123 are kept open and thus the chamber may still communicate with the chamber cleaning gas supply. Therefore, the chamber cleaning gas supplied from the chamber cleaning gas supply may be readily transferred to the chamber through the vacuum isolation valve 100 of the present invention.

Meanwhile, while the first blocker 137 is covering the first surface 121 of the tube isolator 120, the second blocker 144 is stationary at a fixed position, thereby preventing the first blocker 137 from moving in the opposite direction to the second direction b. Accordingly, the first blocker 137 is in close contact with the first surface 121, preventing leakage of the chamber cleaning gas through the first surface 121.

Since the first blocker 137 blocks the first surface 121 and thus the chamber cleaning gas is not introduced into the housing 110, the second blocker 144 may not be exposed to the chamber cleaning gas. As a result, the second blocker 144 and the second sealing member 146 installed on one surface of the second blocker 144 may be protected against the chamber cleaning gas.

Figure 6:
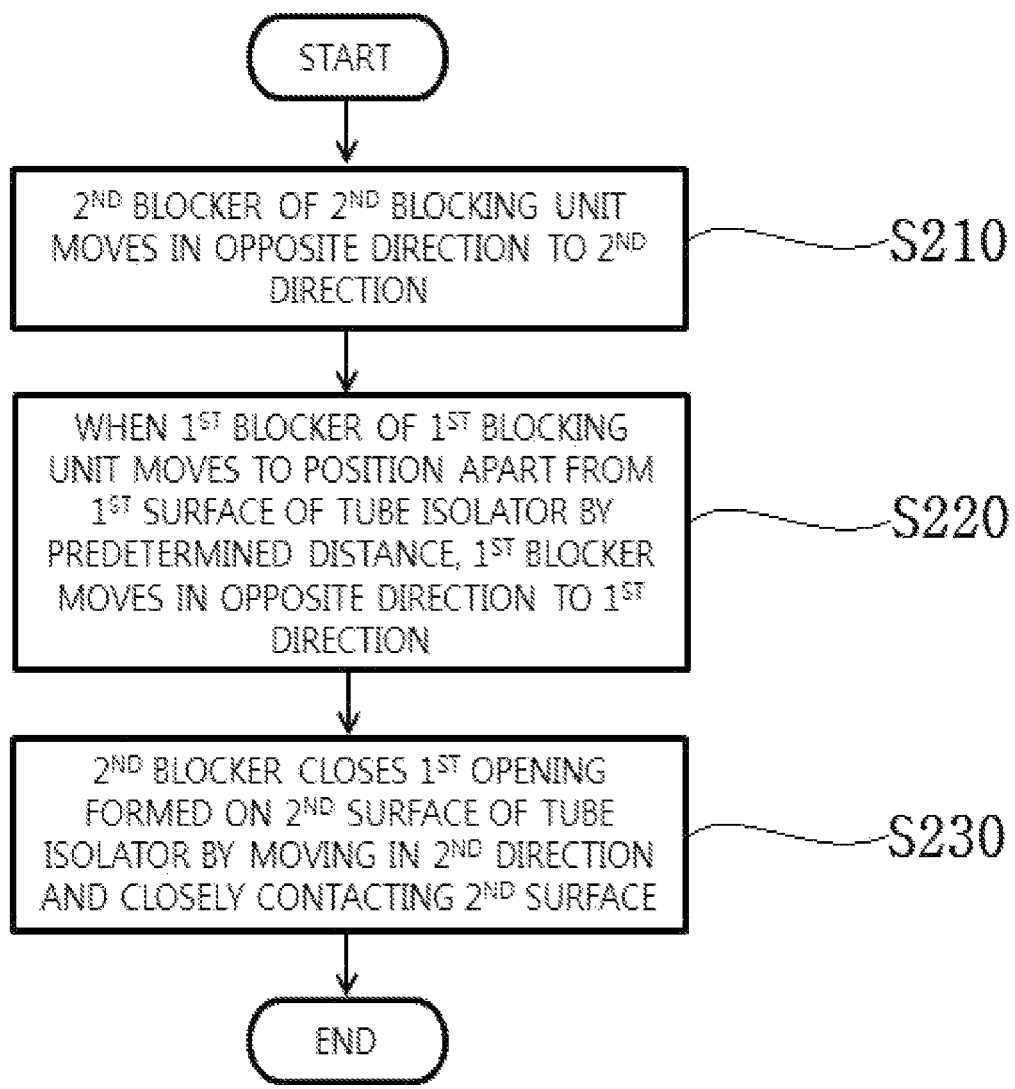
FIG. 6 is a flowchart illustrating an operation for blocking a first opening formed on a second surface of the tube isolator by a second blocking unit according to an embodiment of the present invention.
Figure 7:
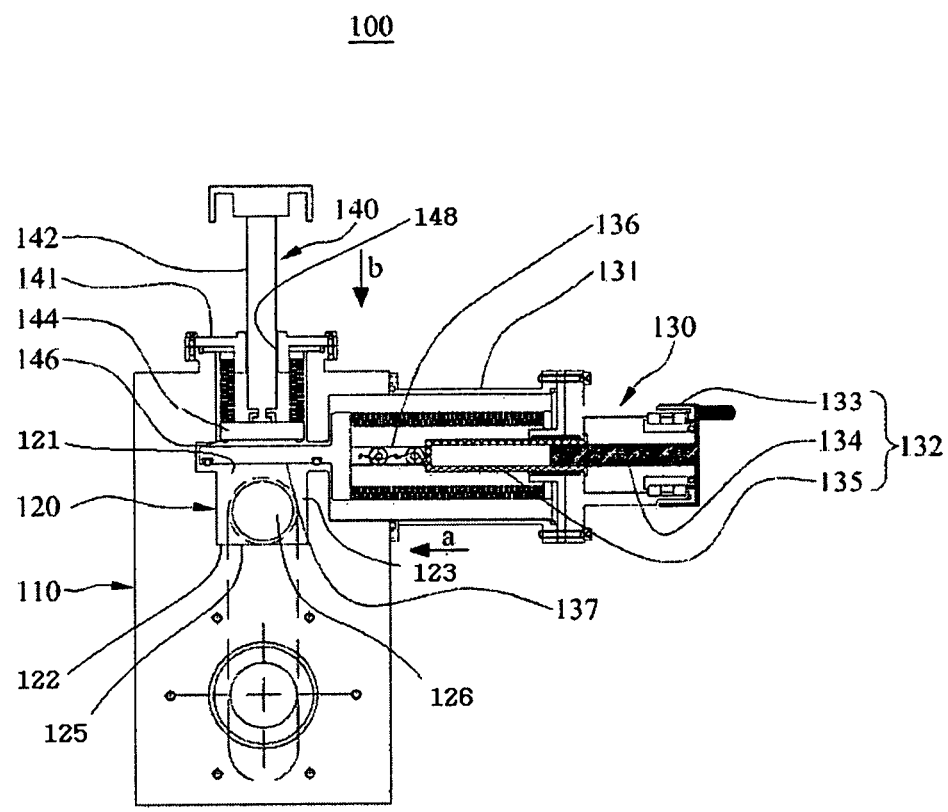
FIG. 7 is a view illustrating a third operation state of the vacuum isolation valve according to an embodiment of the present invention.
Figure 8:
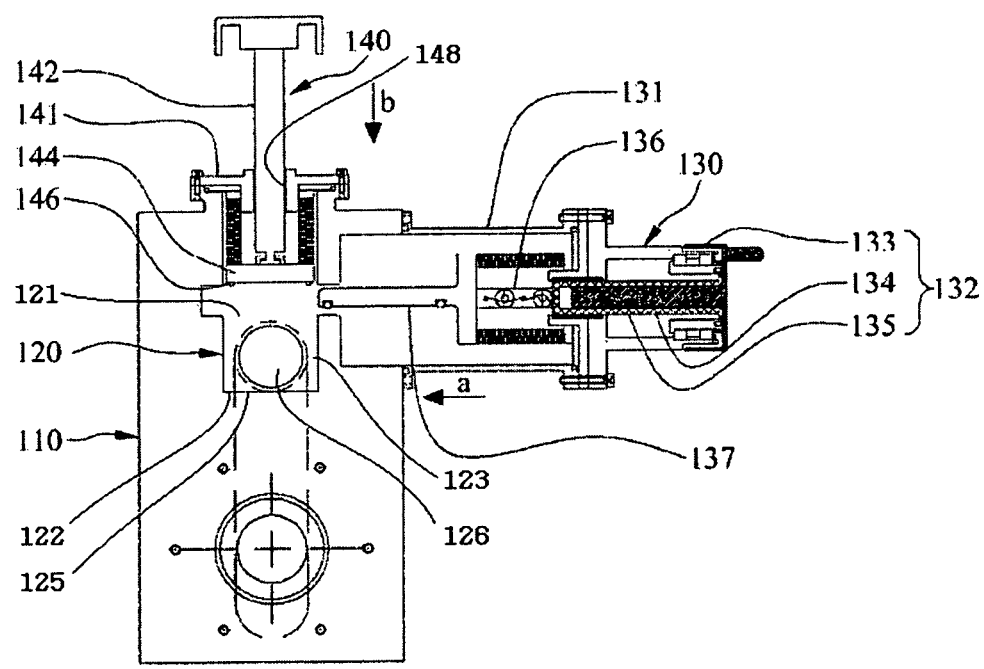
FIG. 8 is a view illustrating a fourth operation state of the vacuum isolation valve according to an embodiment of the present invention.
Figure 9:
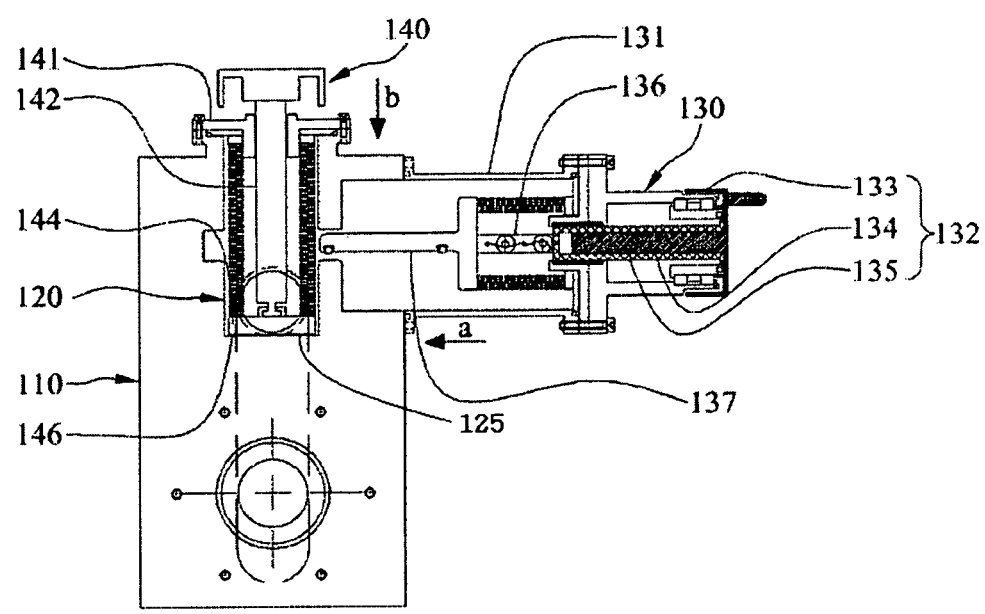
FIG. 9 is a view illustrating a fifth operation state of the vacuum isolation valve according to an embodiment of the present invention.

FIG. 6 is a flowchart illustrating an operation for isolating the first opening 125 formed on the second surface 122 of the tube isolator 120 by the second blocking unit 140 according to an embodiment of the present invention, FIG. 7 is a view illustrating a third operation state of the vacuum isolation valve 100 according to an embodiment of the present invention, FIG. 8 is a view illustrating a fourth operation state of the vacuum isolation valve 100 according to an embodiment of the present invention, and FIG. 9 is a view illustrating a fifth operation state of the vacuum isolation valve 100 according to an embodiment of the present invention.

Referring to FIGS. 6 to 9, the second blocker 144 of the second blocking unit 140 moves in the opposite direction to the second direction b in operation 5210 (refer to FIG. 7). Herein, the second blocker 144 may be moved in the opposite direction to the second direction b by means of the second mover 142. For example, the second mover 142 may rotate counterclockwise in screw-engagement with the cover 141. Since the cover 141 is fixed in the housing 110 during the rotation of the second mover 142, the second mover 142 screw-engaged with the cover 141 may move in the opposite direction to the second direction b. As the second blocker 144 moves in the opposite direction to the second direction b, the first blocker 137 may be released from the pressed state.

When the first blocker 137 is released from the pressed state, the first blocker 137 may move in the opposite direction to the second direction b to a position spaced from the first surface 121 of the tube isolator 120 by a predetermined distance.

When the first blocker 137 moves to the position spaced from the first surface 121 of the tube isolator 120 by the predetermined distance, the first blocker 137 moves in the opposite direction to the first direction a in operation S220 (refer to FIG. 8). Herein, the first blocker 137 may be moved in the opposite direction to the first direction a by means of the first mover 132. For example, when the handle 133 of the first mover 132 rotates counterclockwise, the rotating shaft 134 rotates counterclockwise and the vertical movement member 135 screw-engaged with the rotating shaft 134 moves in the opposite direction to the first direction a, along the screw thread of the rotating shaft 134. Eventually, the first blocker 137 may move in the opposite direction to the first direction a.

When the first blocker 137 is removed from over the first surface 121 of the tube isolator 120 by moving in the opposite direction to the first direction a, the second blocker 144 moves in the second direction b and is brought into close contact with the second surface 122 of the tube isolator 120 in operation S230 (refer to FIG. 9). As the first opening 125 is closed by the second blocker 144, the chamber may not communicate with the chamber cleaning gas supply any more. That is, the chamber cleaning gas supplied from the chamber cleaning gas supply may not be transferred to the chamber and the air inside the chamber may not be discharged outward.

As described before, while the chamber cleaning gas supply is supplying the chamber cleaning gas to the chamber through communication between the chamber and the chamber cleaning gas supply, the first blocker 137 blocks the first surface 121 of the tube isolator 120 so that the second blocker 144 may not be exposed to the chamber cleaning gas and the second sealing member 146 formed on one surface of the second blocker 144 may not be worn down. Therefore, the second blocker 144 effectively closes the first opening 125 by means of the second sealing member 146 that is not worn down, thereby preventing leakage of the inner air of the chamber and effectively maintaining the chamber isolated from an ambient environment.

As is apparent from the above description of the vacuum isolation valve according to the present invention, since the second blocking unit selectively closes the first opening 125 formed on the second surface of the tube isolator, the chamber does not communicate with the chamber cleaning gas supply. Therefore, the chamber can be readily kept isolated from an ambient environment.

According to the vacuum isolation valve of the present invention, the first blocking unit blocks the opened first surface of the tube isolator, thus preventing exposure of the second blocking unit to the chamber cleaning gas during supply of the chamber cleaning gas from the chamber cleaning gas supply to the chamber through the housing. That is, the first blocking unit protects the second blocking unit against exposure to the chamber cleaning gas. As a result, the sealing member formed on one surface of the second blocking unit is not exposed to the chamber cleaning gas and thus is not worn down by the chamber cleaning gas.

According to the vacuum isolation valve of the present invention, the first blocking unit can be removed by blocking communication between the chamber and the chamber cleaning gas supply using the second blocking unit. Therefore, the first blocking unit including the sealing member can be easily repaired.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A vacuum isolation valve, comprising:
   a housing including a tube;
   a hollow tube isolator connected to the tube at a predetermined position of the tube, for selectively isolating the tube;
   a first blocking unit installed to the housing and configured to move in a first direction to a position above an opened first surface of the tube isolator; and
   a second blocking unit installed to the housing and configured to move in a second direction, the second blocking unit arranged to press the first blocking unit to selectively block the first opened surface, when the first blocking unit moves in the first direction, and configured to move further in the second direction and pass through the first surface of the tube isolator, being inserted into the tube isolator, and block the tube, in close contact with a surface facing the first surface, when the first blocking unit moves in an opposite direction to the first direction.

2. The vacuum isolation valve according to claim 1, wherein the first direction is perpendicular to the second direction.

3. The vacuum isolation valve according to claim 1, wherein a first opening is formed on a second surface of the tube isolator facing the first surface of the tube isolator for passing a chamber cleaning gas, and a second opening is formed on a third surface of the tube isolator near to the second surface of the tube isolator for passing the chamber cleaning gas.

4. The vacuum isolation valve according to claim 3, wherein when the first blocking unit moves in the opposite direction to the first direction, the second blocking unit closes the first opening by moving in the second direction, being inserted into the tube isolator through the first surface, and closely contacting the second surface.

5. The vacuum isolation valve according to claim 3, wherein the housing further includes:
   a first installation hole extended from the first surface; and
   a second installation hole branched from the first installation hole,
   wherein the first installation hole is perpendicular to the second installation hole.

6. The vacuum isolation valve according to claim 5, wherein the first blocking unit comprises:
   a body fixed to the housing, extended from an end portion of the second installation hole;
   a first mover installed in the body, movably in the first direction;
   a joint member engaged with a portion of the first mover, movably in the first direction; and
   a first blocker engaged with a portion of the joint member, for selectively blocking the first surface of the tube isolator by moving in the first direction.

7. The vacuum isolation valve according to claim 6, wherein the body is hollow to communicate with the second installation hole.

8. The vacuum isolation valve according to claim 6, wherein the first mover comprises:
   a handle installed rotatably at a portion of the body;
   a rotating shaft fixed to a center of the handle, inside the body; and
   a vertical movement member accommodated in the body, which is engaged with the joint member at a first end of the vertical movement member and screw-engaged with the rotating shaft at a second end of the vertical movement member to be movable in the first direction.

9. The vacuum isolation valve according to claim 8, wherein the first blocking unit further comprises:
   a first bellows connecting an inner surface of the body to one surface of the first blocker, for accommodating the vertical movement member and the joint member.

10. The vacuum isolation valve according to claim 6, wherein the first blocker has a 'T'-shaped section.

11. The vacuum isolation valve according to claim 6, wherein a first sealing member is installed on a surface of the first blocker facing the first surface.

12. The vacuum isolation valve according to claim 11, wherein the first sealing member is an O-ring.

13. The vacuum isolation valve according to claim 5, wherein the second blocking unit comprises:
   a cover fixed in the first installation hole and having an engagement hole formed at a center of the cover;
   a second mover screw-engaged with the engagement hole to be movable in the second direction; and
   a second blocker engaged with a portion of the second mover, for pressing the first blocking unit or selectively blocking the tube isolator by moving in the second direction.

14. The vacuum isolation valve according to claim 13, wherein an engagement member is formed at a portion of the second mover, a container is formed on a surface of the second blocker, for accommodating the engagement member, and the engagement member is rotatable in the container.

15. The vacuum isolation valve according to claim 13, wherein the second blocking unit further comprises:
   a second bellows connecting one surface of the cover to one surface of the second blocker, for accommodating the second mover.

16. The vacuum isolation valve according to claim 13, wherein a second sealing member is installed on a surface of the second blocker closely contacting the second surface.

17. The vacuum isolation valve according to claim 16, wherein the second sealing member is an O-ring.

* * * * *